(12) United States Patent
Peng et al.

(10) Patent No.: US 9,123,522 B2
(45) Date of Patent: Sep. 1, 2015

(54) BROADBAND ION BEAM ANALYZER (71) Applicant: BEIJING ZHONGKEXIN ELECTRONICS EQUIPMENT CO.,LTD., Beijing (CN)

(72) Inventors: Libo Peng, Beijing (CN); Huiyue Long, Beijing (CN); Junyu Xie, Beijing (CN)

(73) Assignee: BEIJING ZHONGKEXIN ELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 14/357,139

(22) PCT Filed: Nov. 2, 2012

(86) PCT No.: PCT/CN2012/084004
§ 371 (c)(1),
(2) Date: May 8, 2014

(87) PCT Pub. No.: WO2013/067902
PCT Pub. Date: May 16, 2013

(65) Prior Publication Data
US 2014/0312223 A1 Oct. 23, 2014

(30) Foreign Application Priority Data
Nov. 10, 2011 (CN) .......................... 2011 1 0354972

(51) Int. Cl.
*H01J 49/30* (2006.01)
*H01J 37/05* (2006.01)
*H01J 37/317* (2006.01)

(52) U.S. Cl.
CPC ................ *H01J 49/30* (2013.01); *H01J 37/05* (2013.01); *H01J 37/3171* (2013.01); *H01J 2237/055* (2013.01); *H01J 2237/057* (2013.01)

(58) Field of Classification Search
CPC ... H01J 2237/057; H01J 37/05; H01J 37/153; H01J 37/3171; H01J 2237/055; H01J 49/30
USPC ...................... 250/281, 298, 396 ML, 492.21
See application file for complete search history.

(56) References Cited

U.S. PATENT DOCUMENTS

| | | | |
|---|---|---|---|
| 3,617,739 A | 11/1971 | Liebl | |
| 3,787,790 A * | 1/1974 | Hull et al. | ..................... 335/210 |
| 4,945,236 A | 7/1990 | Mogami et al. | |
| 4,967,078 A | 10/1990 | Purser | |
| 2010/0243879 A1 * | 9/2010 | Huang et al. | .................. 250/281 |

FOREIGN PATENT DOCUMENTS

| | | |
|---|---|---|
| CN | 101692369 | 4/2010 |
| JP | 10308191 | 11/1988 |

OTHER PUBLICATIONS

International Search Report for PCT/CN2012/084004 mailed Feb. 14, 2013.

* cited by examiner

*Primary Examiner* — Michael Logie
(74) *Attorney, Agent, or Firm* — Nixon & Vanderhye P.C.

(57) ABSTRACT

A broadband ion beam analyzer, used for isolating required ions from a broadband ion beam, comprises an upper magnetic pole (1), a lower magnetic pole (2), an upper excitation coil (3), a lower excitation coil (4), an analysis grating (7), and a magnetic yoke (5 and 6). The upper magnetic pole (1) and the lower magnetic pole (2) are both provided with a camber-shaped incident-end boundary (101) and a camber-shaped emergence side boundary (102). The camber radii (Rb) of the incident-end boundary (101) and of the emergence-end boundary (102) are equal to the deflection radius (R) of the required ions in the magnetic field. The required ions in the broadband ion beam are allowed to focus ideally at the mid-section of the magnetic field, to acquire an ideal focal spot having a size that equals to zero. This allows for acquisition of the optimal resolution by selecting an appropriate width for a minimal analysis gap (701), thus implementing complete isolation of the required ions from other ions in the broadband ion beam.

4 Claims, 8 Drawing Sheets

BROADBAND ION BEAM ANALYZER

This application is the U.S. national phase of International Application No. PCT/CN2012/084004 filed 2 Nov. 2012 which designated the U.S. and claims priority to CN 201110354972.7 filed 10 Nov. 2011, the entire contents of each of which are hereby incorporated by reference.

TECHNOLOGY FIELD

The present invention relates to the field of ion mass analysis technology, specifically, relates to a broadband ion beam analyzer which is used to isolate required ions from a broadband ion beam.

BACKGROUND OF RELATED ART

A broadband ion beam analyzer is a core component of an implanter and is used to isolate ions under the influence of a magnetic field or an electrical field according to the mass-to-charge ratio.

A broadband ion beam analyzer in the prior art comprises an upper magnetic pole and a lower magnetic pole, the upper magnetic pole and the lower magnetic pole are respectively connected to an upper excitation coil and a lower excitation coil, while both of the upper excitation coil and the lower excitation are connected to an electrical source. When being electrified, a magnetic field will be generated in the space between the two magnetic poles, and ions with different mass-to-charge ratio have different deflection radius in the magnetic field. Therefore, the analysis grating disposed in the space between the two magnetic poles enables the required ions to be isolated from other ions in the broadband ion beam. The required ions will pass through the analysis gap of the analysis grating, while other ions are shielded by the analysis grating. The upper magnetic pole and the lower magnetic pole are both provided with an incident-end boundary and an emergence-end boundary. The broadband ion beam is emitted into the magnetic field from the incident face of the magnetic field at the side of the incident-end boundary, and is emitted out of the magnetic field from the emergence face of the magnetic field at the side of the emergence-end boundary after being deflected for 180° in the magnetic field and focusing at the mid-section of the magnetic field to form a focal spot. As for the broadband ion beam analyzer in the prior art, since the incident-end boundary and the emergence-end boundary of the upper magnetic pole and the lower magnetic pole are planes or curved surfaces, after the broadband ion beam being emitted into the magnetic field from the incident face of the magnetic field, the required ions can not focus ideally, that is, focal spot's size does not equal to zero. Further, since the width of the analysis gap of the analysis grating must be at least larger than the size of the focal spot, a large analysis gap allows ions besides the required ions to pass therethrough, which makes it hard to completely isolate the required ions from other ions.

SUMMARY

Accordingly, the aim of the present invention is to provide a broadband ion beam analyzer to address the problem that the required ions can not focus ideally, that is, the focal spot's size does not equal to zero, and a large analysis gap allows ions besides the required ions to pass therethrough, which makes it hard to completely isolate the required ions from other ions.

To achieve the aim mentioned above, the present invention provides a broadband ion beam analyzer for isolating the required ions from the broadband ion beam, the broadband ion beam analyzer including an upper magnetic pole, a lower magnetic pole, an upper excitation coil, a lower excitation coil, an analysis grating and a magnetic yoke, wherein:

The upper excitation coil and the lower excitation coil respectively surround the upper magnetic pole and the lower magnetic pole, and both of the upper excitation coil and the lower excitation coil are connected to an electrical source to generate an uniform magnetic field in the space between the upper magnetic pole and the lower magnetic pole, the broadband ion beam is emitted into the uniform magnetic field from the incident face of the uniform magnetic field, and the required ions are deflected for 180° in the uniform magnetic field and are then emitted out of the uniform magnetic field from the emergence face of the uniform magnetic field;

Corresponding to the incident face of the uniform magnetic field, the upper magnetic pole and the lower magnetic pole are both provided with a camber-shaped incident-end boundary; corresponding to the emergency face of the uniform magnetic field, the upper magnetic pole and the lower magnetic pole are both provided with a camber-shaped emergence-end boundary; both the camber radii of the incident-end boundary and the emergence-end boundary are equal to the deflection radius of the required ions in the uniform magnetic field; for both of the upper magnetic pole and the lower magnetic pole, the distance between the center of the incident-end boundary and the center of the emergence-end boundary is twice as large as the deflection radius;

The analysis grating is provided in the space between the upper magnetic pole and the lower magnetic pole and is adapted to selectively enable the required ions to pass therethrough, an analysis gap is provided on the analysis grating and is located at the position where the required ions focus in the uniform magnetic field;

The magnetic yoke is provided around the upper magnetic pole and the lower magnetic pole.

To achieve the aim mentioned above, the present invention also provides another broadband ion beam analyzer for isolating the required ions from the broadband ion beam, the broadband ion beam analyzer including an upper magnetic pole, a lower magnetic pole, an upper excitation coil, a lower excitation coil, an analysis grating and a magnetic yoke, wherein:

The upper excitation coil and the lower excitation respectively surround the upper magnetic pole and the lower magnetic pole, and both of the upper excitation coil and the lower excitation coil are connected to an electrical source to generate a sectional uniform magnetic field in the space between the upper magnetic pole and the lower magnetic pole, the broadband ion beam is emitted into the sectional uniform magnetic field from the incident face of the sectional uniform magnetic field, and the required ions are deflected for 180° in the sectional uniform magnetic field and are then emitted out of the sectional uniform magnetic field from the emergence face of the sectional uniform magnetic field; the sectional uniform magnetic field includes uniform incident magnetic field, uniform middle magnetic field and uniform emergence magnetic field, wherein the intensity of the incident magnetic field equals to the intensity of the emergence magnetic field, and both of the intensity of the incident magnetic field and that of the emergence magnetic field are stronger than that of the middle magnetic field;

Corresponding to the incident face of the sectional uniform magnetic field, the upper magnetic pole and the lower magnetic pole are both provided with a camber-shaped incident-end boundary; corresponding to the emergence face of the sectional uniform magnetic field, the upper magnetic pole and the lower magnetic pole are both provided with a camber-shaped emergence-end boundary;

The analysis grating is provided in the space between the upper magnetic pole and the lower magnetic pole and is adapted to selectively enable the required ions to pass, an analysis gap is provided on the analysis grating and is located at the position where the required ions focus in the sectional uniform magnetic field;

The magnetic yoke is provided around the upper magnetic pole and the lower magnetic pole.

Preferably, both of the interface between the incident magnetic field and the middle magnetic field and the interface of the middle magnetic field and the emergence magnetic field are planes.

Preferably, both of the interface between the incident magnetic field and the middle magnetic field and the interface between the middle magnetic field and the emergence magnetic field are cambers.

The present invention is beneficial in the following aspects with respect to the prior art:

(1) The broadband ion beam analyzer provided in the present invention enables the required ions in the broadband ion beam to focus ideally at the mid-section in the magnetic field with an ideal focal spot which has a size equaling to zero, by adopting an upper magnetic pole and a lower magnetic pole provided with a camber-shaped incident-end boundary and a camber-shaped emergence-end boundary, wherein both of the camber radii of the incident-end boundary and the emergence-end boundary are equal to the deflection radius of the required ions in the magnetic field. Complete isolation of the required ions from other ions in the broadband ion beam is complemented by selecting an appropriate width for a minimal analysis gap and acquiring an optimal analysis resolution.

(2) Another broadband ion beam analyzer provided in the present invention enables the required ions in the broadband ion beam to focus ideally at the mid-section in the magnetic field with an ideal focal spot which has a size equaling to zero, by adopting a sectional uniform magnetic field. Complete isolation of the required ions from other ions in the broadband ion beam is complemented by selecting an appropriate width for a minimal analysis gap and acquiring an optimal analysis resolution.

Description of the reference numbers in the accompany drawings:

| | |
|---|---|
| 1. Upper magnetic pole | 2. Lower magnetic pole |
| 3. Upper excitation coil | 4. Lower excitation coil |
| 5. End magnetic yoke | 6. Middle magnetic yoke |
| 7. Analysis grating | 8. Incident ion beam |
| 9. Emergence ion beam | |
| 10. Incident face | 11. Emergence face |
| 12. The first interface | 13. The second interface |
| 14. Broad gap lead-out ion source | 15. Lead-out electrode |
| 16. Broadband ion beam analyzer | 17. Measuring beam Faraday |
| 18. Implanting target platform | |
| 101. Incident-end boundary | 102. Emergence-end boundary |
| 201. Incident-end boundary | 202. Emergence-end boundary |
| 701. Analysis gap | 801. Center axis of the ion beam |

DETAILED DESCRIPTION OF EMBODIMENTS

In the following, embodiments of the present invention will be explained in detail with the accompany drawings.

The First Embodiment

Figure 1:
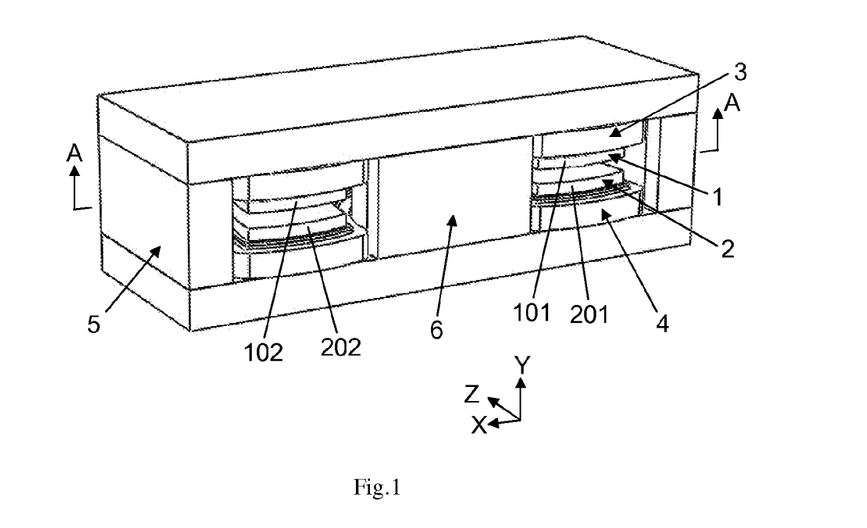
FIG. 1 is a perspective schematic view of the first embodiment of the broadband ion beam analyzer of the present invention.
Figure 2:
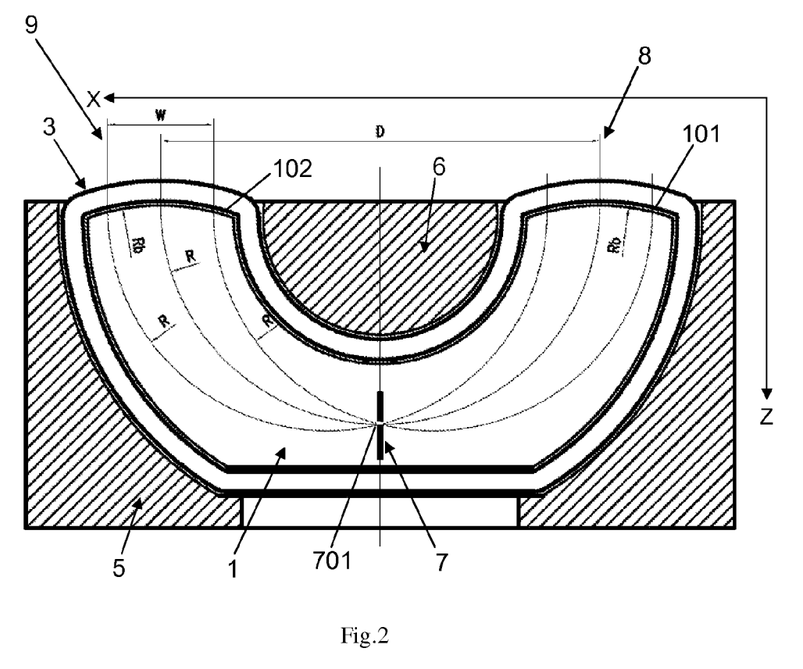
FIG. 2 is the cross sectional schematic view of the broadband ion beam analyzer shown in FIG. 1 taken along A-A direction.
Figure 3:
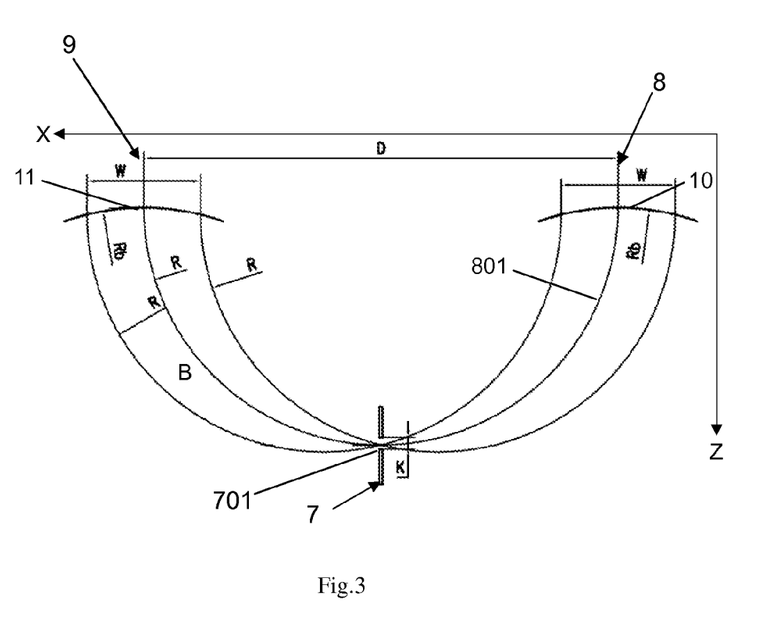
FIG. 3 is a schematic view of the broadband ion beam in the broadband ion beam analyzer of the first embodiment under a state of focusing in horizontal direction.

As shown in FIGS. 1-3, the broadband ion beam analyzer of the first embodiment comprises an upper magnetic pole 1, a lower magnetic pole 2, an upper excitation coil 3, a lower excitation coil 4, an analysis grating 7 and a magnetic yoke, wherein:

The upper excitation coil 3 and the lower excitation coil 4 respectively surround the upper magnetic pole 1 and the lower magnetic pole 2, and both of the upper excitation coil 3 and the lower excitation coil 4 are connected to an electrical source to generate a magnetic field B in the space between the upper magnetic pole 1 and the lower magnetic pole 2, the magnetic field B between the upper magnetic pole 1 and the lower magnetic pole 2 is a uniform magnetic field; the incident ion beam 8 is an incident broadband ion beam and is emitted horizontally into the magnetic field B from the incident face 10 of the magnetic field B along Z-direction, the center of the incident ion beam 8 is the center axis of ion beam

801; the emergence ion beam 9 is emitted horizontally out of the magnetic field B from the emergence face 11 of the magnetic field B; ions in the emergence ion beam 9 are the required ions isolated from the incident ion beam 8, wherein the required ions are deflected for 180° in the magnetic field B.

Corresponding to the incident face 10 of the magnetic field B, the upper magnetic pole 1 and the lower magnetic pole 2 are provided respectively with a camber-shaped incident-end boundary 101, 102; corresponding to the emergency face 11 of the magnetic field, the upper magnetic pole 1 and the lower magnetic pole 2 are provided respectively with a camber-shaped emergence-end boundary 102, 202; Both of the camber radii Rb of the incident-end boundary 101, 201 and the emergence-end boundary 102, 202 equal to the deflection radius R of the required ions in the magnetic field B; the upper magnetic pole 1 and the lower magnetic pole 2 are symmetrically provided and these two poles are of the same dimension and shape. Distance (i.e. the center distance D between the incident ion beam 8 and the emergence ion beam 9) between the center of the incident-end boundary 101 of the upper magnetic pole 1 and the center of the emergence-end boundary 102 of the lower magnetic pole 1 is twice as large as the deflection radius R; similarly, the distance between the center of the incident-end boundary 201 of the upper magnetic pole 2 and the center of the emergence-end boundary 202 of the lower magnetic pole 2 is twice as large as the deflection radius R; the required ions in the broadband ion beam can focus at the mid-section of the magnetic field to form an ideal focal spot which has a size equaling to zero.

The analysis grating 7, which is provided in the middle of the space between the upper magnetic pole 1 and the lower magnetic pole 2, selectively enables the required ions isolated from the broadband ion beam to pass therethrough; an analysis gap 701 is provided on the analysis grating 7, and is located at the position where the required ions focus in the magnetic field B; after the incident ion beam 8 being emitted into the magnetic field B, the required ions focus at the analysis gap 701 and then pass through the analysis gap 701, while other ions are shielded by the analysis gap 701 and can not pass therethrough, so that to achieve the isolation of the required ions from the other ions in the broadband ion beam;

The magnetic yoke is provided around the upper magnetic pole 1 and the lower magnetic pole 2; in this embodiment, the magnetic yoke includes end magnetic yoke 5 and middle magnetic yoke 6, wherein upon reasonably utilizing the shape of the magnetic field, the end magnetic yoke 5 and the middle magnetic yoke 6 are respectively disposed far away from the magnetic field where the broadband ion beam passes, so that to reduce the weight of the broadband ion beam analyzer.

In the ion analysis with the broadband ion beam analyzer of this embodiment, the following two equations can be obtained from the intensity of the uniform magnetic field B, deflection radius R of required ions in the broadband ion beam in the magnetic field B, width W of the broadband ion beam, ion energy E of the broadband ion beam, ion charge q, width K of the analysis gap 701 of the analysis grating 7, and mass m of the ion:

$$E = \frac{1}{2}mv^2 \tag{1}$$

$$R = \frac{mv}{qB} \tag{2}$$

By selecting appropriate related parameters for the camber of incident face 10 of the magnetic field B, such as the camber radii Rb and relative position of the center points of the cambers, ideal focusing state with theoretical focal spot which has a size of dw=0 can be acquired, thus an ideal mass resolution can be acquired. In the present embodiment, Rb=R, D=2R, accordingly, the focal spot size acquired is: dw=0. By selecting parameters for the camber of the emergence face 11 which is symmetric to the incident face 10, analysis on the shifting deflection for 180° of the incident ion beam 8 can be implemented, and the distortion of beam angle, law of uniform profile and others can be minimized.

According to the definition of the resolution, when other ions with a difference of dm from the ions mass m have a change of dR with respect to the deflection radius R which meets dR≥dw, isolation of these two kinds of ions with a difference of dm therebetween can be implemented. At this time, the width K of the analysis gap 701 meets: K≤dw≤dR;

Analysis resolution for ions with the same energy can be derived from the following steps according to Equation (1) and Equation (2):

First, Equation (3) can be derived from Equation (1) and Equation (2):

$$m = \frac{q^2 B^2}{2E} R^2 \tag{3}$$

And then, Equation (4) can be derived by differentiating m with respect to R, $$\frac{dm}{dR} = \frac{q^2 B^2}{E} R = \frac{2m}{R} \tag{4}$$

Finally, analysis resolution of the broadband ion beam analyzer can be achieved as follows:

$$\frac{m}{dm} = \frac{0.5R}{dR} \tag{5}$$

It can be seen from Equation (5) that, analysis resolution can be improved by reducing the allowable dR. Therefore, when the theoretical focal spot size meets dw=0, the optimal analysis resolution can be acquired by selecting an appropriate minimum width K of the analysis gap 701. The analysis resolution is calculated with dR being replaced by K as follows:

$$\frac{m}{dm} = \frac{0.5R}{K} \tag{6}$$

As shown in FIG. 3, in the analysis on the broadband ion beam with the broadband ion beam analyzer of the present embodiment, horizontal profile heights of the emergence ion beam 9 are consistent with that of the incident ion beam 8, which leads to ideal uniformity and angel characteristics and makes it possible to form an ideal focal spot at the mid-section of the magnetic field, and thus a high resolution analysis on broadband ion beam can be achieved.

Figure 4:
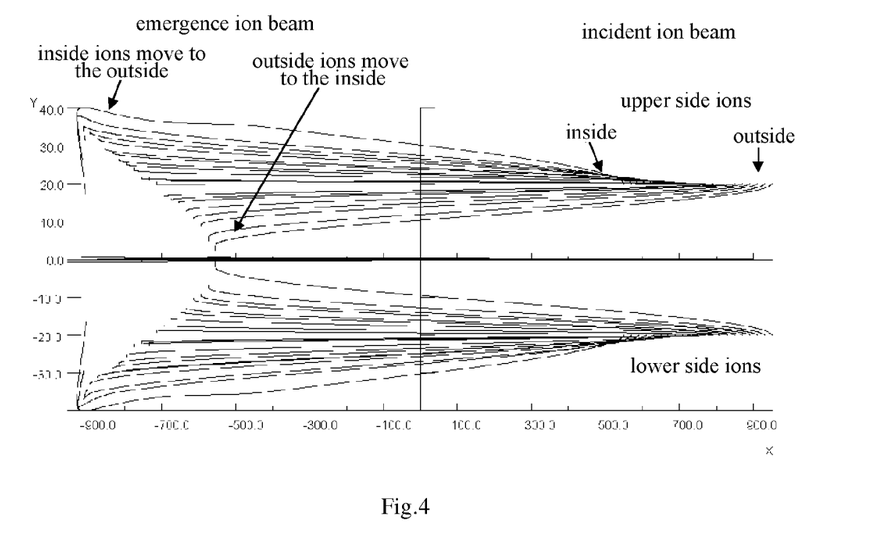
FIG. 4 is a schematic view of the broadband ion beam in the broadband ion beam analyzer of the first embodiment under a state of focusing in vertical direction.

However, as shown in FIG. 4, in the analysis on the broadband ion beam with the broadband ion beam analyzer of the present embodiment, because the magnetic field at the incident face 10 and the emergence face 11 has edge field effect, for the ions which are emitted into the magnetic field B in parallel, different ions have different edge field focusing effect due to different incident angle, resulting in that though the analyzed broadband ion beam is capable to keep the same height with the incident ion beam 8 in horizontal direction, the original outside ions in the incident ion beam 8 move to the inside and the original inside ions move to outside due to the large difference of the angel in vertical direction (i.e., Y-direction), that is, the inside beam focuses and the outside beam diverges.

The Second Embodiment

Figure 5:
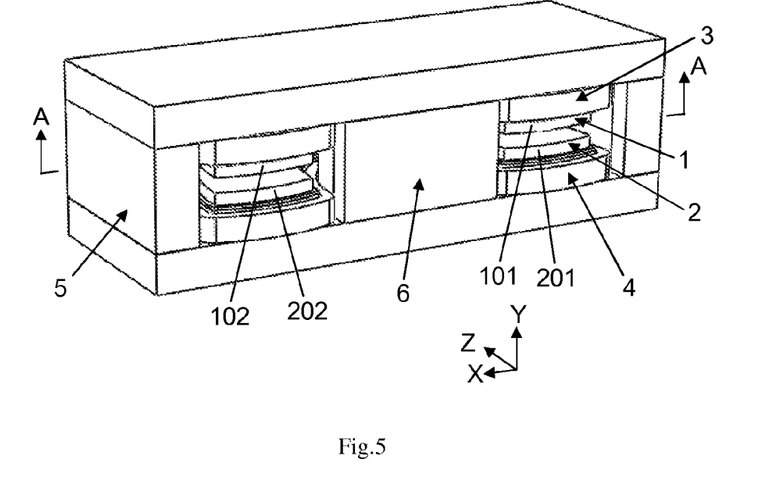
FIG. 5 is a perspective schematic view of the second embodiment of the broadband ion beam analyzer of the present invention.
Figure 6:
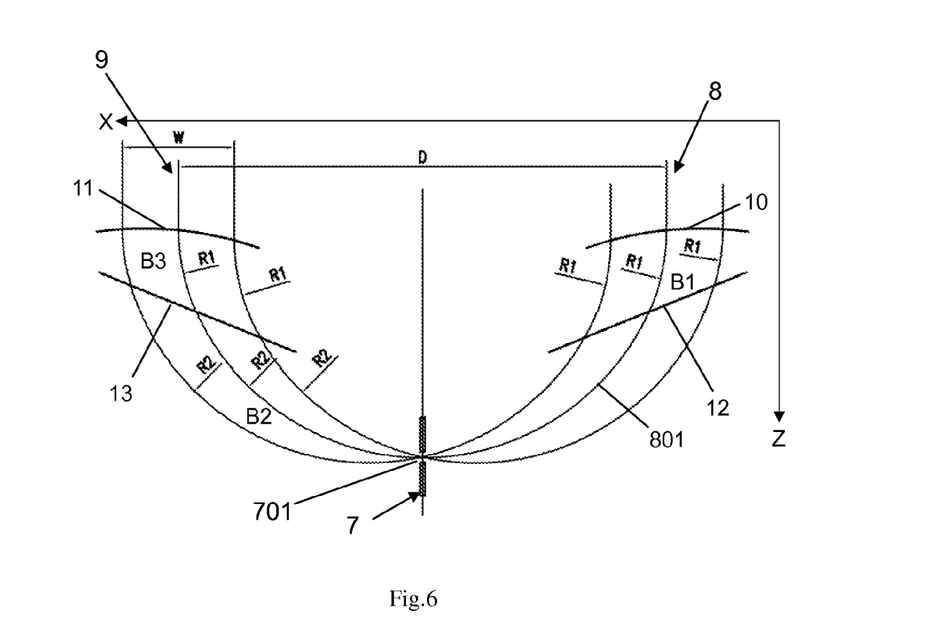
FIG. 6 is a schematic view of the broadband ion beam in the broadband ion beam analyzer of the second embodiment under a state of focusing in horizontal direction.
Figure 7:
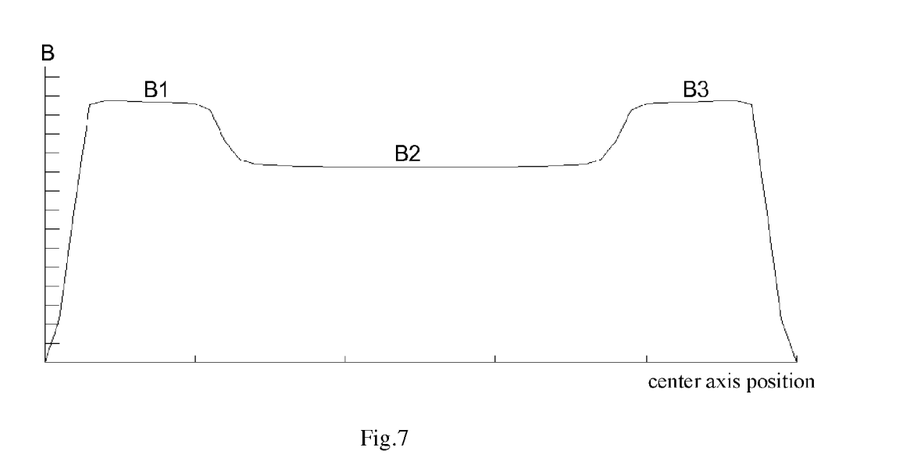
FIG. 7 is a profile graph of the location of the magnetic field along the center axis of the broadband ion beam in the broadband ion beam analyzer of the second embodiment.

As shown in FIGS. 5-7, the broadband ion beam analyzer in the second embodiment comprises an upper magnetic pole 1, a lower magnetic pole 2, an upper excitation coil 3, a lower excitation coil 4, an analysis grating 7 and a magnetic yoke, wherein:

The upper magnetic pole 1 and the lower magnetic pole 2 are disposed symmetrically, the upper excitation coil 3 and the lower excitation coil 4 respectively surround the upper magnetic pole 1 and the lower magnetic pole 2; both of the upper excitation coil 3 and the lower excitation coil 4 coil are connected to an electrical source to generate a magnetic field in the space between the upper magnetic pole 1 and the lower magnetic pole 2; the magnetic field between the upper magnetic pole 1 and the lower magnetic pole 2 is a sectional uniform magnetic field, which includes incident magnetic field B1, middle magnetic field B2 and emergence magnetic field B3; magnetic field B1, middle magnetic field B2 and emergence magnetic field B3 are all uniform magnetic fields; the intensity of the incident magnetic field B1 equals to the intensity of the emergence magnetic field B3, and both of the intensity of the incident magnetic field B1 and that of the emergency magnetic field B3 are stronger than that of the middle magnetic field B2; the interface between the incident magnetic field B1 and the middle magnetic field B2 is the first interface 12, and the interface between the middle magnetic field B2 and the emergence magnetic field B3 is the second interface 13, wherein both of the first interface 12 and the second interface 13 are planes; the deflection radius of the required ions in the incident magnetic field B1 and the emergence magnetic field B3 is R1, the deflection radius of the required ions in the middle magnetic field B2 is R2, and R2>R1; the incident ion beam 8 is an incident broadband ion beam that is emitted into the magnetic field horizontally from the incident face 10 of the magnetic field along Z-direction, the center of the incident ion beam 8 being the center axis of the ion beam 801; the emergence ion beam 9 is horizontally emitted out of the magnetic field from the emergence face 11 of the magnetic field, and ions in the emergence ion beam 9 are the required ions isolated from the incident ion beam 8, the required ions being deflected for 180° in the magnetic field and being capable to form an ideal focal spot at the midsection of the magnetic field.

Corresponding to the incident face 10 of magnetic field, the upper magnetic pole 1 and the lower magnetic pole 2 are provided respectively with a camber-shaped incident-end boundary 101, 102; and corresponding to the emergence face 11 of the magnetic field, the upper magnetic pole 1 and the lower magnetic pole 2 are provided respectively with a camber-shaped emergence-end boundary 102, 202.

The analysis grating 7, which is provided in the middle of the space between the upper magnetic pole 1 and the lower magnetic pole 2, selectively enables the required ions isolated from the broadband ion beam to pass; an analysis gap 701 is provided on the analysis grating 7 and is located at the position where the required ions focus in the magnetic field; after the incident ion beam 8 being emitted into the magnetic field, the required ions focus at the analysis gap 701 and then pass through the analysis gap 701, while other ions are shielded by the analysis gap 701 and can not pass therethrough, so that to achieve the isolation of the required ions from the other ions in the broadband ion beam.

The magnetic yoke is provided around the upper magnetic pole 1 and the lower magnetic pole 2; in this embodiment, the magnetic yoke includes end magnetic yoke 5 and middle magnetic yoke 6, wherein upon reasonably utilizing the shape of the magnetic field, the end magnetic yoke 5 and the middle magnetic yoke 6 are respectively disposed far away from the magnetic field where the broadband ion beam passes, so that to reduce the weight of the broadband ion beam analyzer.

In the first embodiment, because the magnetic field at the incident face 10 and the emergence face 11 has edge field effect, for the ions which are emitted into the magnetic field B in parallel, different ions have different edge field focusing effect due to different incident angle, resulting in that though the analyzed broadband ion beam is capable to keep the same height with the incident ion beam 8 in horizontal direction, the original outside ions in the incident ion beam 8 move to the inside and the original inside ions move to outside due to the large difference of the angel in vertical direction (i.e., Y-direction), that is, the inside beam focuses and the outside beam diverges.

As shown in FIGS. 7-10, in the present embodiment, since the broadband ion beam analyzer adopts the sectional uniform magnetic field which is divided into sections along the center axis of the ion beam 801, the angel characteristics of the broadband ion beam in vertical direction (i.e. Y-direction) is improved, and the focusing ability and transmission efficiency of the broadband ion beam are enhanced. The mode of the sectional uniform magnetic field utilizes the horizontal component of the magnetic field at the interface of the magnetic field to increase the whole focusing characteristics of the broadband ion beam. The angle of inclination and horizontal coordinate of the interface of the magnetic field are associated to the incident face 10 and the emergence face 11 of the magnetic field to make sure that the broadband ion beam has an ideal focal spot at the analysis grating 7, and that the angle and uniformity characteristics of emergence ion beam 9 are consistent with that of the incident ion beam 8. In the sectional uniform magnetic field, magnetic field intensity of the incident magnetic field B1, the middle magnetic field B2 and the emergence magnetic field B3 can be acquired by adjusting the distance between the upper magnetic pole and the lower magnetic pole, which are up-down symmetrical. The intensity of the magnetic filed satisfies: $B \infty 1/d$ ($\infty$ is a sign for a direct proportion), wherein, d is the distance between the corresponding positions of the upper magnetic pole 1 and the lower magnetic pole 2.

In the second embodiment, the broadband ion beam analyzer adopting the sectional uniform magnetic field still has the theoretical focal spot size dw=0, while the resolution is determined by the width K of the analysis gap 701 of the analysis grating 7, and analysis resolution can still be calculated by Equation (6).

Figure 8:
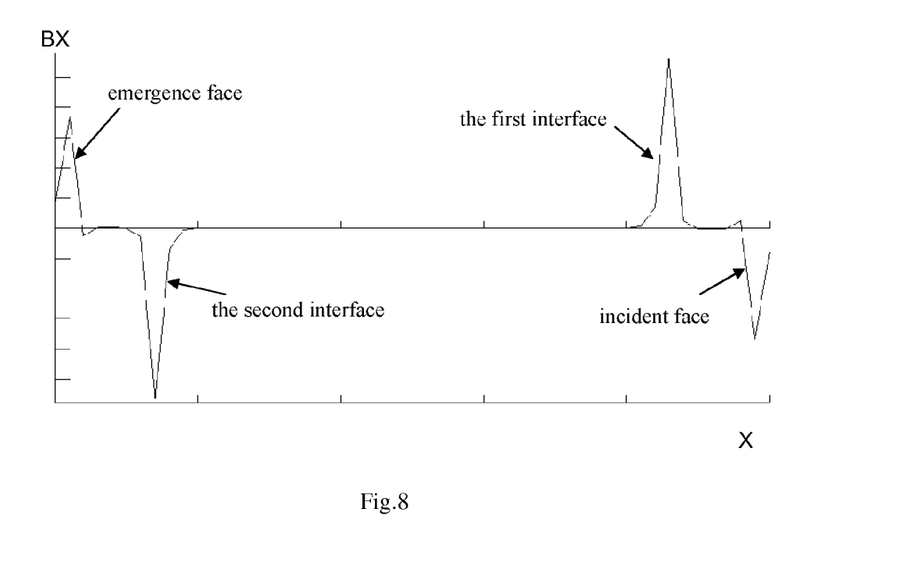
FIG. 8 is the profile graph of the magnetic field in the broadband ion beam analyzer of the second embodiment in X-direction.
Figure 9:
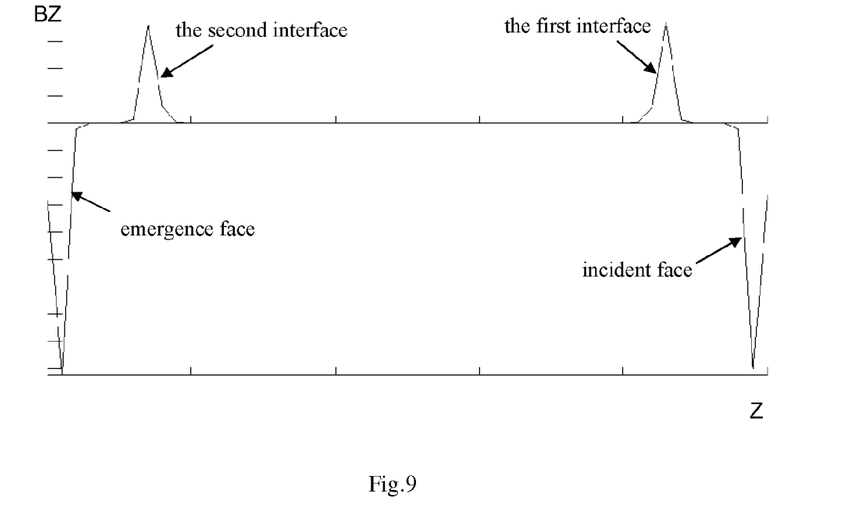
FIG. 9 is the profile graph of the magnetic field in the broadband ion beam analyzer of the second embodiment in Z-direction.
Figure 10:
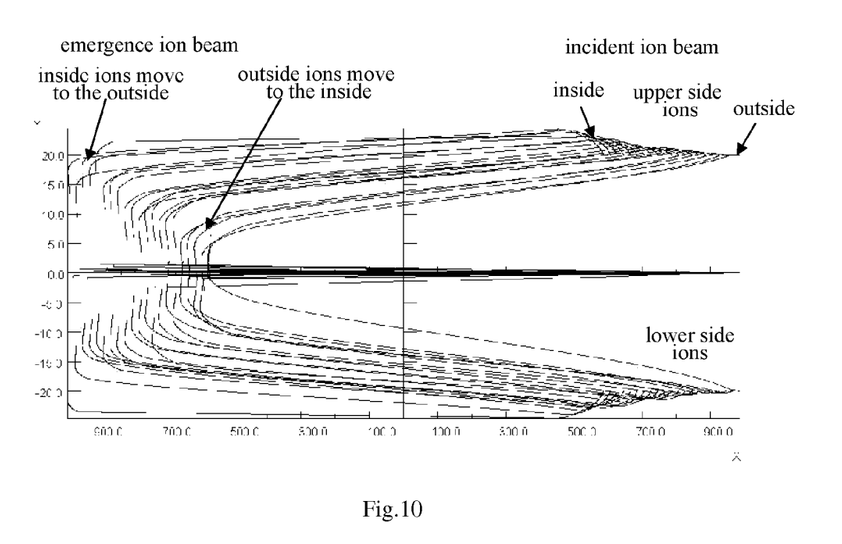
FIG. 10 is a schematic view of the broadband ion beam in the broadband ion beam analyzer of the second embodiment under a state of focusing in vertical direction.

Upon adopting the sectional uniform magnetic field, the profile of the intensity of the magnetic field is shown in FIGS. 7-9. By introducing the sectional uniform magnetic field, magnetic field at the first interface and the second interface has horizontal magnetic field components BX and BZ in X-direction and Z-direction, respectively. Horizontal magnetic field components BX and BZ make the passing ions to better focus, wherein the focusing strength can be adjusted by adjusting the difference of the intensity of the sectional magnetic field, the middle interface and the incident angle of the ions at the middle interface. The optimized sectional uniform magnetic field make the passing ion beam to better focus in vertical direction, which increasing the transmission efficiency of the ion beam without changing the characteristics of the ion beam in horizontal direction.

The Third Embodiment

Figure 11:
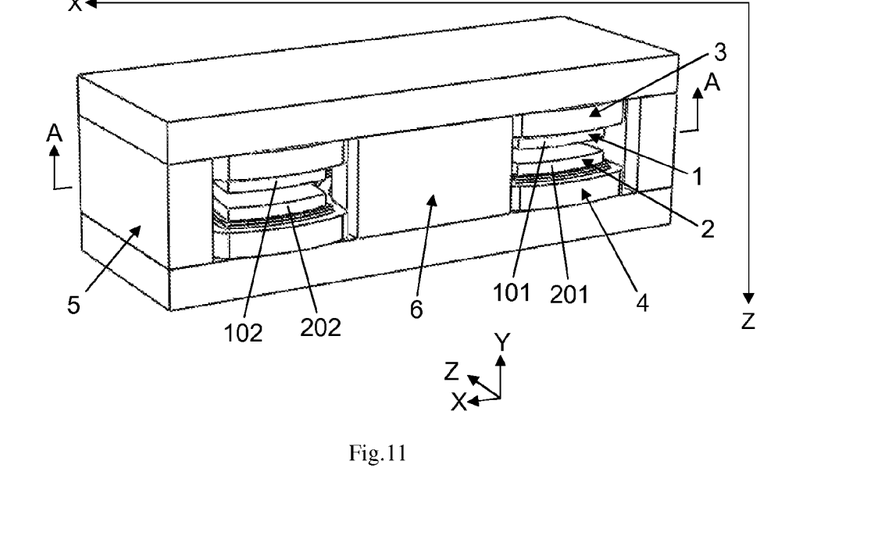
FIG. 11 is a perspective schematic view of the third embodiment of the broadband ion beam analyzer of the present invention.
Figure 12:
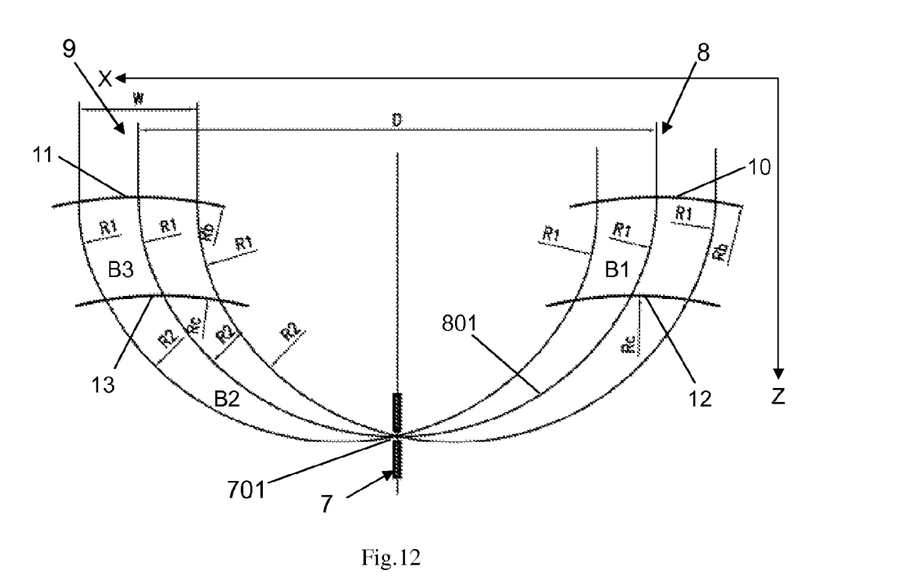
FIG. 12 is a schematic view of the broadband ion beam in the broadband ion beam analyzer of the third embodiment under a state of focusing in horizontal direction.

As shown in FIGS. 11-12, the broadband ion beam analyzer of the third embodiment comprises an upper magnetic pole 1, a lower magnetic pole 2, an upper excitation coil 3, a lower excitation coil 4, an analysis grating 7 and a magnetic yoke, wherein:

The upper magnetic pole 1 and the lower magnetic pole 2 are disposed symmetrically, the upper excitation coil 3 and the lower excitation coil 4 respectively surround the upper magnetic pole 1 and the lower magnetic pole 2; both of the upper excitation coil 3 and the lower excitation coil 4 are connected to an electrical source to generate a magnetic field in the space between the upper magnetic pole 1 and the lower magnetic pole 2; The magnetic field between the upper magnetic pole 1 and the lower magnetic pole 2 is a sectional uniform magnetic field, which includes incident magnetic field B1, middle magnetic field B2 and emergence magnetic field B3. Magnetic field B1, middle magnetic field B2 and emergence magnetic field B3 are all uniform magnetic fields; the intensity of the incident magnetic field B1 equals to that of the emergence magnetic field B3, and both of the intensity of the incident magnetic field B1 and that of the emergency magnetic field B3 are stronger than that of the middle magnetic field B2; the interface between the incident magnetic field B1 and the middle magnetic field B2 is the first interface 12, and the interface between the middle magnetic field B2 and the emergence magnetic field B3 is the second interface 13, wherein both of the first interface and the second interface are cambers; the camber radii for both of the first interface and the second interface are Rc; the deflection radius of the required ions in the incident magnetic field B1 and the emergence magnetic field B3 is R1, the deflection radius of the required ions in the middle magnetic field B2 is R2, and R2>R1; the incident ion beam 8 is an incident broadband ion beam that is emitted horizontally into the magnetic field from the incident face 10 of the magnetic field along Z-direction, the center of the incident ion beam 8 being the center axis of ion beam 801; the emergence ion beam 9 is horizontally emitted out of the magnetic field from the emergence face 11 of the magnetic field, and ions in the emergence ion beam 9 are the required ions isolated from the incident ion beam 8, the required ions being deflected for 180° in the magnetic field and being capable to form an ideal focal spot at the midsection of the magnetic field.

Corresponding to the incident face 10 of magnetic field, the upper magnetic pole 1 and the lower magnetic pole 2 are provided respectively with a camber-shaped incident-end boundary 101, 102; and corresponding to the emergence face 11 of the magnetic field, the upper magnetic pole 1 and the lower magnetic pole 2 are provided respectively with a camber-shaped emergence-end boundary 102, 202.

The analysis grating 7, which is provided in the middle of the space between the upper magnetic pole 1 and the lower magnetic pole 2, selectively enables the required ions isolated from the broadband ion beam to pass; an analysis gap 701 is provided on the analysis grating 7 and is located at the position where the required ions focus in the magnetic field; after the incident ion beam 8 being emitted into the magnetic field, the required ions focus at the analysis gap 701 and then pass through the analysis gap 701, while other ions are shielded by the analysis gap 701 and can not pass therethrough, so that to achieve the isolation of the required ions from the other ions in the broadband ion beam.

The magnetic yoke is provided around the upper magnetic pole 1 and the lower magnetic pole 2; in this embodiment, the magnetic yoke includes end magnetic yoke 5 and middle magnetic yoke 6, wherein upon reasonably utilizing the shape of the magnetic field, the end magnetic yoke 5 and the middle magnetic yoke 6 are respectively disposed far away from the magnetic field where the broadband ion beam passes, so that to reduce the weight of the broadband ion beam analyzer.

In the first embodiment, because the magnetic field at the incident face 10 and the emergence face 11 has edge field effect, for the ions which are emitted into the magnetic field B in parallel, different ions have different edge field focusing effect due to different incident angle, resulting in that though the analyzed broadband ion beam is capable to keep the same height with the incident ion beam 8 in horizontal direction, the original outside ions in the incident ion beam 8 move to the inside and the original inside ions move to outside due to the large difference of the angel in vertical direction (i.e., Y-direction), that is, the inside beam focuses and the outside beam diverges.

Since the broadband ion beam analyzer in the third embodiment adopts the sectional uniform magnetic field, the angel characteristics of the broadband ion beam in vertical direction (i.e., Y-direction) is improved, and the focusing ability and transmission efficiency of the broadband ion beam are enhanced. The mode of the sectional uniform magnetic field utilizes the horizontal component of the magnetic field at the interface of the magnetic field to increase the whole focusing characteristics of the broadband ion beam. The radius and the center of the camber of the interface of the magnetic field are associated to the incident face 10 and the emergence face 11 of the magnetic field to make sure that the broadband ion beam has an ideal focal spot at the analysis grating 7, and that the angle and uniformity characteristics of emergence ion beam 9 are consistent with that of the incident ion beam 8. In the sectional uniform magnetic field, magnetic field intensity of the incident magnetic field B1, the middle magnetic field B2 and the emergence magnetic field B3 can be acquired by adjusting the distance between the upper magnetic pole and the lower magnetic pole, which are up-down symmetrical. The intensity of the magnetic filed satisfies: $B \infty 1/d$ ($\infty$ is a sign for a direct proportion), wherein, d is the distance between the corresponding positions of the upper magnetic pole 1 and the lower magnetic pole 2.

In the third embodiment, the broadband ion beam analyzer adopting the sectional uniform magnetic field still has the theoretical focal spot size dw=0, while the resolution is determined by the width K of the analysis gap 701 of the analysis grating 7, and analysis resolution can still be calculated by Equation (6).

Upon adopting the sectional uniform magnetic field, by introducing the sectional uniform magnetic field, magnetic field at the first interface and the second interface has horizontal magnetic field components BX and BZ in X-direction and Z-direction, respectively. Horizontal magnetic field components BX and BZ make the passing ions to better focus, wherein the focusing strength can be adjusted by adjusting the difference of the intensity of the sectional magnetic field, the middle interface and the incident angle of the ions at the middle interface. The optimized sectional uniform magnetic field make the passing ion beam to better focus in vertical direction, which increasing the transmission efficiency of the ion beam without changing the characteristics of the ion beam in horizontal direction.

Figure 13:
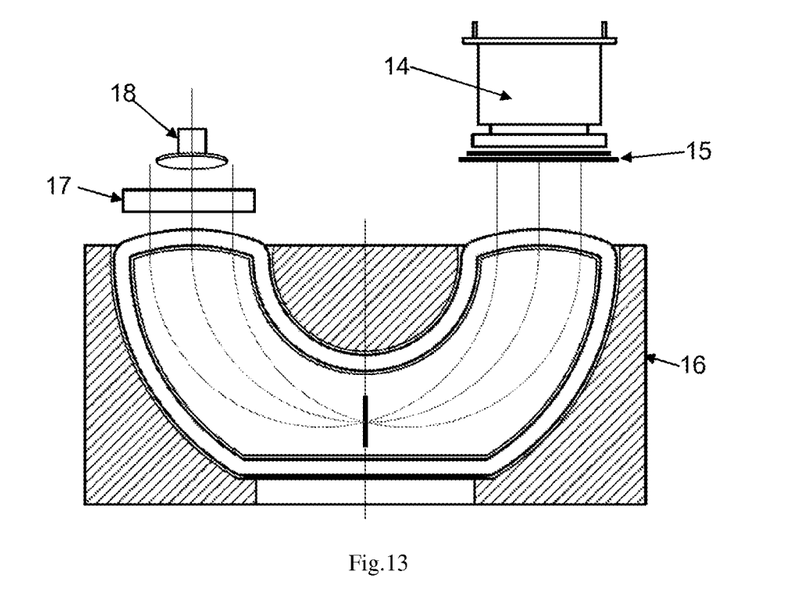
FIG. 13 is a schematic view of the configuration of an implanter with the broadband ion beam analyzer of the first embodiment.
Figure 14:
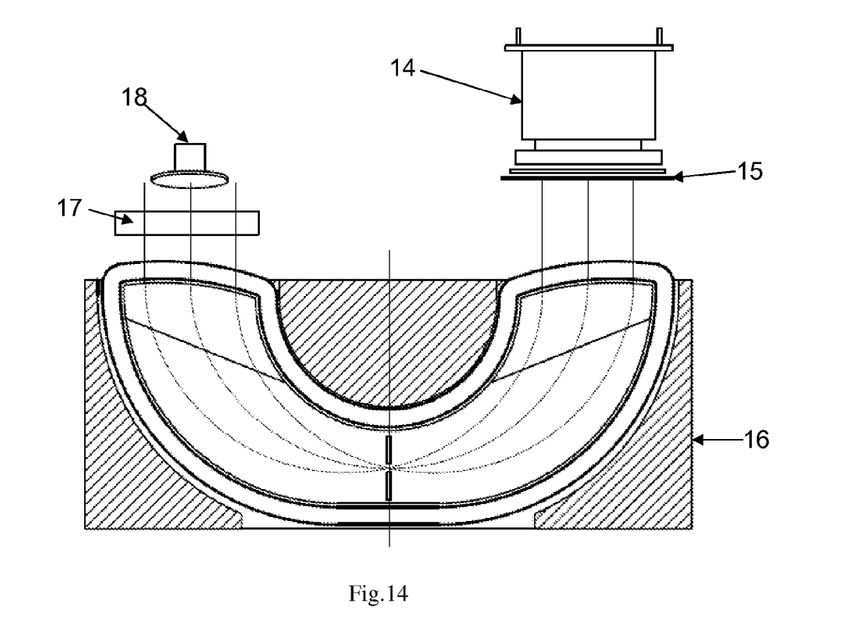
FIG. 14 is a schematic view of the configuration of an implanter with the broadband ion beam analyzer of the second embodiment.
Figure 15:
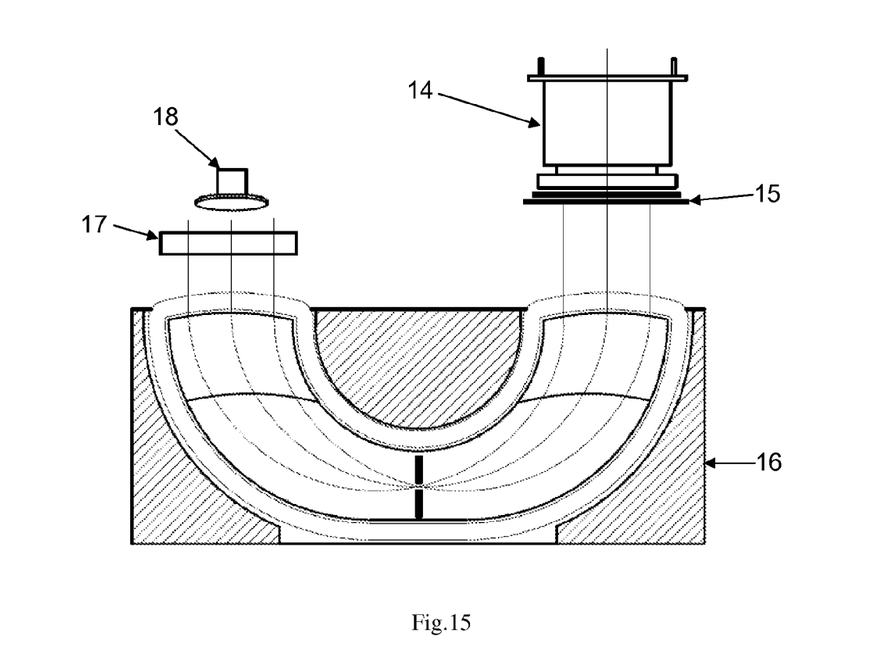
FIG. 15 is schematic view of the configuration of an implanter with the broadband ion beam analyzer of the third embodiment.

As shown in FIGS. 13-15, the implanter 16 with the broadband ion beam analyzer presented in the above three embodiments of the present invention includes broad gap lead-out ion source 14, lead-out electrode 15, broadband ion beam analyzer 16, measuring beam Faraday 17, implanting target platform 18. For the broadband ion beam obtained from the broad gap lead-out ion source 14, its horizontal width dimension is large enough to cover the horizontal width of the final implanted workpiece. After the broadband ion beam has been analyzed by the broadband ion beam analyzer 16, the required ions pass through the analysis gap of the middle section of the analysis grating and then arrive at the measuring beam Faraday 17, while other ions are shielded by the analysis grating and can not pass. Measuring beam Faraday 17 measures the beam flux parameter of the broadband ion beam which will be then implanted to the workpiece, and then measuring beam Faraday 17 is moved away from the broadband ion beam to allow the broadband ion beam to be implanted into the workpiece on the implanting target platform 18. During the process of implanting, the implanting target platform 18 drives the implanted workpiece to reciprocate mechanically to pass through the broadband ion beam in the vertical direction to make the ions in the broadband ion beam to be implanted onto the surface of the workface uniformly.

The above mentioned embodiments are only the illustrative embodiments of the present invention and are not intended to limit the present invention. The scope of present invention is defined by the claims appended. The skilled person in the art can make other modifications or equivalents within the spirit and the scope of present invention, these modifications or equivalents are included in the scope of present invention.

The invention claimed is:

1. A broadband ion beam analyzer for isolating the required ions from a broadband ion beam, characterized by comprising an upper magnetic pole, a lower magnetic pole, an upper excitation coil, a lower excitation coil, an analysis grating and a magnetic yoke, wherein:
the upper excitation coil and the lower excitation coil surround the upper magnetic pole and the lower magnetic pole respectively, and both of the upper excitation coil and the lower excitation coil are connected to an electrical source to generate an uniform magnetic field in the space between the upper magnetic pole and the lower magnetic pole, the broadband ion beam is emitted into the uniform magnetic field from the incident face of the uniform magnetic field, and the required ions are deflected for 180° in the uniform magnetic field and are then emitted out of the uniform magnetic field from the emergence face of the uniform magnetic field;
corresponding to the incident face of the uniform magnetic field, the upper magnetic pole and the lower magnetic pole are both provided with an arc-shaped incident-end boundary; corresponding to the emergency face of the uniform magnetic field, the upper magnetic pole and the lower magnetic pole are both provided with an arc-shaped emergence-end boundary; both the arc radii of the incident-end boundary and the emergence-end boundary are equal to the deflection radius of the required ions in the uniform magnetic field; for both of the upper magnetic pole and the lower magnetic pole, the distance between the center of the incident-end boundary and the center of the emergency-end boundary is twice as large as the deflection radius;
the analysis grating is provided in the space between the upper magnetic pole and the lower magnetic pole and is adapted to selectively enable the required ions to pass therethrough, an analysis gap is provided on the analysis grating and is located at the position where the required ions focus in the uniform magnetic field;
the magnetic yoke is provided around the upper magnetic pole and the lower magnetic pole.

2. A broadband ion beam analyzer for isolating the required ions from the broadband ion beam, characterized by including an upper magnetic pole, a lower magnetic pole, an upper excitation coil, a lower excitation coil, an analysis grating and a magnetic yoke, wherein:
the upper excitation coil and the lower excitation surround the upper magnetic pole and the lower magnetic pole respectively, and both of the upper excitation coil and the lower excitation coil are connected to an electrical source to generate a sectional magnetic field in the space between the upper magnetic pole and the lower magnetic pole, the broadband ion beam is emitted into the sectional uniform magnetic field from the incident face of the sectional uniform magnetic field, and the required ions are deflected for 180° in the sectional uniform magnetic field and are then emitted out of the sectional uniform magnetic field from the emergence face of the sectional uniform magnetic field; the sectional uniform magnetic field includes uniform incident magnetic field, uniform middle magnetic field and uniform emergency magnetic field, wherein the intensity of the incident magnetic field equals the intensity of the emergency magnetic field, and both of the intensity of the incident magnetic field and that of the emergency magnetic field are stronger than that of the middle magnetic field;
corresponding to the incident face of the sectional uniform magnetic field, the upper magnetic pole and the lower magnetic pole are both provided with an arc-shaped incident-end boundary; corresponding to the emergency face of the sectional uniform magnetic field, the upper magnetic pole and the lower magnetic pole are both provided with an arc-shaped emergence-end boundary;
the analysis grating is provided in the space between the upper magnetic pole and the lower magnetic pole and is adapted to selectively enable the required ions to pass, an analysis gap is provided on the analysis grating and is located at the position where the required ions focus in the sectional uniform magnetic field;
the magnetic yoke is provided around the upper magnetic pole and the lower magnetic pole.

3. The broadband ion beam analyzer of claim 2, wherein, both of an interface between the incident magnetic field and the middle magnetic field and an interface between the middle magnetic field and the emergence magnetic field are planes.

4. The broadband ion beam analyzer of claim 2, wherein, both of an interface between the incident magnetic field and the middle magnetic field and an interface between the middle magnetic field and the emergence magnetic field are arcs.

* * * * *